(12) United States Patent
Harada et al.

(10) Patent No.: US 6,379,460 B1
(45) Date of Patent: Apr. 30, 2002

(54) THERMAL SHIELD DEVICE AND CRYSTAL-PULLING APPARATUS USING THE SAME

(75) Inventors: Kazuhiro Harada; Yoji Suzuki; Senlin Fu; Hisashi Furuya, all of Tokyo (JP)

(73) Assignee: Mitsubishi Materials Silicon Corporation, Tokyo (JP)

( * ) Notice: Subject to any disclaimer, the term of this patent is extended or adjusted under 35 U.S.C. 154(b) by 0 days.

(21) Appl. No.: 09/644,183

(22) Filed: Aug. 23, 2000

(51) Int. Cl.$^7$ ............................................... C30B 35/00
(52) U.S. Cl. ..................... 117/217; 117/200; 117/218; 117/222; 117/900
(58) Field of Search ................................. 117/200, 217, 117/218, 222, 900

(56) References Cited

U.S. PATENT DOCUMENTS

| | | | | |
|---|---|---|---|---|
| 5,968,264 A | * | 10/1999 | Iida et al. | 117/30 |
| 6,036,776 A | * | 3/2000 | Kotooka et al. | 117/217 |
| 6,146,459 A | * | 11/2000 | Park | 117/217 |

* cited by examiner

*Primary Examiner*—Felisa Hiteshew
(74) *Attorney, Agent, or Firm*—Reed Smith LLP (57) ABSTRACT

A thermal shield device is equipped in a crystal-pulling apparatus for pulling a silicon monocrystal ingot from a silicon melt reserved in a quartz crucible having an outer peripheral surface encircled with a heater. The thermal shield device has a tubular part to be used for surrounding a silicon monocrystal ingot being pulled and grown in an upward direction to prevent radiant heat from the heater toward the silicon monocrystal ingot. The tubular part has a lower end positioned above a surface of the silicon melt with a predetermined spacing therebetween. A protruding part is formed on a lower portion of the tubular part and filled with a thermal-insulating member. The protruding part extends to the inside of the tubular part and has a bottom wall, a vertical wall, and a top wall. The bottom wall is shaped like a ring having an outer edge connected to a lower edge of the tubular part and extends to the proximity of an outer peripheral surface of the silicon monocrystal ingot. The vertical wall is positioned at a predetermined distance from the outer peripheral surface of the silicon monocrystal ingot and connected to an inner edge of the bottom wall. The top wall has a lower edge connected to an upper edge of the vertical wall and an upper edge attached to an inner peripheral surface of the tubular part and extends in an upward direction with a gradual increase in diameter.

30 Claims, 8 Drawing Sheets

THERMAL SHIELD DEVICE AND CRYSTAL-PULLING APPARATUS USING THE SAME

BACKGROUND OF THE INVENTION

1. Field of the Invention

The present invention relates to a thermal shield device provided in a crystal-pulling apparatus for pulling and growing a silicon monocrystal ingot from a melt and (hereinafter also referred to as a crystal-pulling apparatus) also relates a crystal-pulling apparatus using such a thermal shield device.

2. Description of Related Art

Heretofore, various apparatuses for pulling and growing silicon monocrystal ingots have been disclosed in many publications. Among them, for example, Examined Japanese Patent Application No. 57-40119 (1982) discloses a crystal-pulling apparatus comprising a chamber having a quartz crucible that reserves a silicon melt and a thermal shield device provided between an external surface of silicon monocrystal ingot and an internal surface of the quartz crucible so that the ingot is enclosed with the thermal shield device. That is, the thermal shield device comprises a tubular member that surrounds the periphery of the silicon monocrystal ingot to be pulled upward and is positioned above the surface of the silicon melt with the predetermined space between them to prevent the radiation of heat from a heater. A liquid level of the silicon melt is gradually decreased as the silicon crystal is gradually pulled from the silicon melt, so that an inner peripheral wall of the quartz crucible becomes being exposed. The radiation of heat from the inner peripheral surface of the exposed quartz crucible is emitted toward the outer peripheral surface of the silicon monocrystal ingot. Thus, the thermal sealed member blocks such radiation to prevent that the radiation of heat extends to the outer peripheral surface of the silicon monocrystal ingot, so that the silicon monocrystal ingot can be cooled quickly to accelerate a solidification thereof during the pulling step.

In addition, Unexamined Japanese Patent Application No. 8-325090 (1996) discloses a tubular member of such a kind of the thermal shield device, which is configured as a multi-layer structure comprising a base material and a covering member. The base material is a graphite or the like having a heat-resisting property at a temperature corresponding to that of the radiation. On the other hand, the covering member is made of a quartz or the like having a lower thermal emissivity in comparison with that of the base material. Such a configuration of the thermal shield device increases the effects of preventing the radiation of heat from the crucible and the heater to the silicon monocrystal ingot by covering the base material having a high thermal emissivity with the covering member having a thermal emissivity lower than that of the base material. Consequently, the rate of pulling the silicon monocrystal ingot from the melt can be increased as the cooling of the silicon monocrystal ingot is accelerated, so that the productivity of the silicon monocrystal ingot can be increased.

However, the thermal shield device of the crystal-pulling apparatus disclosed in Unexamined Japanese Patent Application No. 8-325090 (1996) causes the nonuniform distribution of temperature in a portion of the silicon monocrystal ingot in proximity to the silicon melt. That is, the maximum temperature can be observed in the center of such a portion, while the temperature is gradually decreased from the center to the outside and a sudden decrease in temperature is observed on the outer periphery of that portion. It is conceivable that the temperature deference between the center and the outer periphery of the silicon monocrystal ingot may be further increased as a diameter of the silicon monocrystal ingot is further increased. Therefore, there is a possibility that a thermal stress may be generated in the silicon monocrystal ingot as a result of the above-described temperature difference.

SUMMARY OF THE INVENTION

It is an object of the present invention to provide a thermal shield device to be provided in a crystal-pulling apparatus for pulling and growing a silicon crystal from a melt to obtain a silicon monocrystal ingot. The thermal shield device allows the prevention of the steep decrease in temperature of the outer periphery of a silicon monocrystal ingot being pulled from the silicon melt to inhibit the generation of thermal stress in the silicon monocrystal ingot.

It is another object of the present invention to provide a crystal-pulling apparatus for pulling and growing a silicon crystal from a melt to obtain a silicon monocrystal ingot. The apparatus has a thermal shield device that allows the prevention of the steep decrease in temperature of the outer periphery of a silicon monocrystal ingot being pulled from the silicon melt to inhibit the generation of thermal stress in the silicon monocrystal ingot.

In the first aspect of the present invention, a thermal shield device equipped in a crystal-pulling apparatus for pulling a silicon monocrystal ingot from a silicon melt reserved in a quartz crucible having an outer peripheral surface encircled with a heater, comprises: a tubular part to be used for surrounding a silicon monocrystal ingot being pulled and grown in an upward direction to prevent radiant heat from the heater toward the silicon monocrystal ingot, having a lower end positioned above a surface of the silicon melt with a predetermined spacing therebetween; and a protruding part formed on a lower portion of the tubular part and filled with a thermal-insulating member, which protrudes in an inward direction and has a bottom wall facing to the silicon melt.

Here, the bottom wall may be shaped like a ring having an outer edge connected to a lower edge of the tubular part and may extend horizontally to the proximity of an outer peripheral surface of the silicon monocrystal ingot. The protruding part may further include: a vertical wall positioned at a predetermined distance from the outer peripheral surface of the silicon monocrystal ingot and connected to an inner edge of the bottom wall, extending in parallel to an axis of the silicon monocrystal ingot or extending at an angle of −30 to +30 degrees with respect to the axis of the silicon monocrystal ingot; and a cone-shaped top wall having a lower edge connected to an upper edge of the vertical wall and an upper edge attached to an inner peripheral surface of the tubular part, extending in an upward direction with a gradual increase in diameter.

Here, an inclined inner wall extending in an upward direction with a gradual decrease in diameter may be formed as an intersection between the vertical wall and the bottom wall and inclined at an angle of 80 degrees or less but not zero with respect to an under surface of the bottom wall so as to satisfy that the relationship between the diameter "d" of the silicon monocrystal ingot and the vertical distance L1 from the lower edge of the vertical wall to the under surface of the bottom wall is represented as $0 \leq L1 \leq d/2$.

Here, the height "H" of the vertical wall may be in the range of 10 mm to d/2 where "d" denotes the diameter of the silicon monocrystal ingot.

Here, the spacing between the outer peripheral surface of the silicon monocrystal ingot and the vertical wall may be in the range of 10 mm to 30 mm.

Here, the relationship among the diameter "D1" of the lower edge of the tubular part, the inner diameter "D2" of the quartz crucible, and the diameter "d" of the silicon monocrystal ingot may be represented as 1.65d<D1<D2.

Here, the tubular part may be formed with a gradual decrease in diameter in a downward direction.

Here, the tubular part may include an inner tubular part, an outer tubular part, and a thermal-insulating member filled in the space between the inner tubular part and the outer tubular part.

Here, at least one ring-shaped heat transfer member having an outer peripheral edge connected to the tubular part or the inclined outer wall and an inner peripheral edge connected to the vertical wall or the inclined inner wall, may be transversely formed in the inside of the protruding part.

Here, an inclined outer wall extending in a downward direction with a gradual decrease in diameter may be formed as an intersection between the tubular part and the bottom wall and inclined at an angle of 80 degrees or less but not zero with respect to an under surface of the bottom wall so as to satisfy that the relationship between the diameter "d" of the silicon monocrystal ingot and the vertical distance "L2" from the lower edge of the tubular part to the under surface of the bottom wall is represented as $0 \leq L2 \leq d/2$.

Here, the bottom wall may be shaped like a cone having an outer edge connected to a lower edge of the tubular part and extends to the proximity of an outer peripheral surface of the silicon monocrystal ingot, with a gradual decrease in diameter in an upward or downward direction at an angle of 80 degrees or less but not zero with respect to a horizontal plane. The protruding part may further include: a vertical wall positioned at a predetermined distance from the outer peripheral surface of the silicon monocrystal ingot and connected to an inner edge of the bottom wall, extending in parallel to an axis of the silicon monocrystal ingot or extending at an angle of −30 to +30 degrees with respect to the axis of the silicon monocrystal ingot; and a cone-shaped top wall having a lower edge connected to an upper edge of the vertical wall and an upper edge attached to an inner peripheral surface of the tubular part, extending in an upward direction with a gradual increase in diameter.

Here, the height "H" of the vertical wall may be in the range of 10 mm to d/2 where "d" is the diameter of the silicon monocrystal ingot.

Here, the spacing between the outer peripheral surface of the silicon monocrystal ingot and the vertical wall may be in the range of 10 mm to 30 mm.

Here, the relationship among the diameter "D1" of the lower edge of the tubular part, the inner diameter "D2" of the quartz crucible, and the diameter "d" of the silicon monocrystal ingot may be represented as 1.65d<D1<D2.

Here, the tubular part may be formed with a gradual decrease in diameter in a downward direction.

Here, the tubular part may include an inner tubular part, an outer tubular part, and a thermal-insulating member filled in the space between the inner tubular part and the outer tubular part.

Here, at least one ring-shaped heat transfer member having an outer peripheral edge connected to the tubular part or the inclined outer wall and an inner peripheral edge connected to the vertical wall or the inclined inner wall, may be transversely formed in the inside of the protruding part.

Here, the bottom wall may include: an outer bottom wall having an outer edge connected to a lower edge of the tubular part, which is inclined at an angle of 80 degrees or less but not zero with respect to a horizontal plane, with gradual decrease in diameter in a downward direction; and an inner bottom wall having an outer edge connected to a lower edge of the outer bottom wall and an inner edge extending to the proximity of the outer peripheral surface of the silicon monocrystal ingot, which is inclined at an angle of 80 degrees or less but not zero with respect to a horizontal plane, with a gradual decrease in diameter in an upward direction. The protruding part may further include: a vertical wall positioned at a predetermined distance from the outer peripheral surface of the silicon monocrystal ingot and connected to an inner edge of the bottom wall, which extends in parallel to an axis of the silicon monocrystal ingot or extending at an angle of −30 to +30 degrees with respect to the axis of the silicon monocrystal ingot; and a cone-shaped top wall having a lower edge connected to an upper edge of the vertical wall and an upper edge attached to an inner peripheral surface of the tubular part, extending in an upward direction with a gradual increase in diameter.

Here, the height "H" of the vertical wall may be in the range of 10 mm to d/2 where "d" may be the diameter of the silicon monocrystal ingot.

Here, the spacing between the outer peripheral surface of the silicon monocrystal ingot and the vertical wall may be in the range of 10 mm to 30 mm.

Here, the relationship among the diameter "D1" of the lower edge of the tubular part, the inner diameter "D2" of the quartz crucible, and the diameter "d" of the silicon monocrystal ingot may be represented as 1.65d<D1<D2.

Here, the tubular part may be formed with a gradual decrease in diameter in a downward direction.

Here, the tubular part may include an inner tubular part, an outer tubular part, and a thermal-insulating member filled in the space between the inner tubular part and the outer tubular part.

Here, at least one ring-shaped heat transfer member having an outer peripheral edge connected to the tubular part or the inclined outer wall and an inner peripheral edge connected to the vertical wall or the inclined inner wall, is transversely formed in the inside of the protruding part.

In the second aspect of the present invention, a crystal-pulling apparatus for pulling and growing a silicon monocrystal ingot from a silicon melt, reserved in a quartz crucible having an outer peripheral surface encircled with a heater, comprising a thermal shield device that includes: a tubular part to be used for surrounding a silicon monocrystal ingot being pulled and grown in an upward direction to prevent radiant heat from the heater toward the silicon monocrystal ingot, having a lower end positioned above a surface of the silicon melt with a predetermined spacing therebetween; and a protruding part formed on a lower portion of the tubular part and filled with a thermal-insulating member, which protrudes in an inward direction and has a bottom wall facing to the silicon melt.

Accordingly, the present invention is able to solve the problems that in the conventional thermal shield device the nonuniform distribution of temperature in a portion of the silicon monocrystal ingot in proximity to the silicon melt where the maximum temperature is observed in the center of such a portion while the temperature is gradually decreased from the center to the outside and a sudden decrease in temperature is observed on the outer periphery of that portion. According to the present invention, on the other hand, the heat radiation from the outer peripheral surface of the silicon monocrystal ingot can be reflected by the vertical wall of the protruding part or prevented by the temperature of the protruding part which is considerably increased by the heat radiation from the high-temperature silicon melt. Thus, the protruding part prevents the steep decrease in temperatures of the outer peripheral portion of the silicon monocrystal ingot. Consequently, the distribution of temperature from the center to the outer peripheral portion of such an ingot can be substantially uniformed. That is, the protruding part allows a vertical thermal gradient in the silicon monocrystal ingot where the radial distribution of temperature in any part thereof is substantially uniform. Thus, the slip generation and first dislocation generation in the resulting product can be prevented as a result of the prevention of thermal stress to be applied in the silicon monocrystal ingot.

According to the present invention, furthermore, the cone-shaped top allows that an inert gas downwardly passing through the space between the outer peripheral portion of the silicon monocrystal ingot and the outer peripheral surface of the tubular part can be smoothly introduced into the space between the silicon melt and the protruding part. Thus, the thermal-insulating part effectively prevents the decrease in temperature of the outer peripheral portion of the silicon monocrystal ingot by accumulating radiant heat from the silicon melt to the protruding part.

The above and other objects, features and advantages of the present invention will become more apparent from the following description of embodiments thereof taken in conjunction with the accompanying drawings.

DETAILED DESCRIPTION OF PREFERRED EMBODIMENTS

We are now describing a first preferred embodiment of the present invention with reference to the attached drawings.

Figure 1:
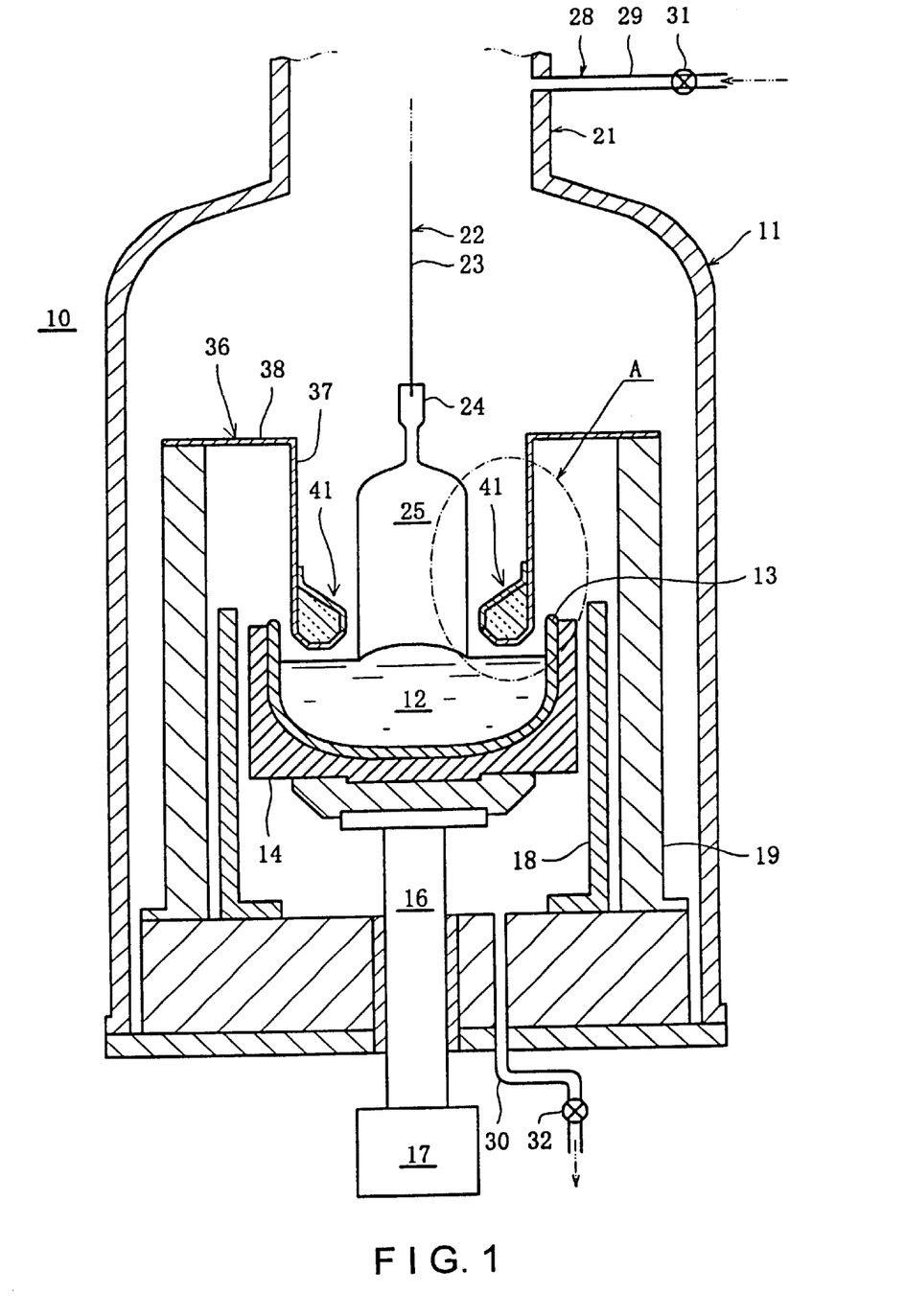
FIG. 1 is a cross sectional view of sectional view of a crystal-pulling apparatus for pulling and growing a silicon crystal from a melt in accordance with a preferred embodiment of the present invention.

Referring to FIG. 1, there is shown a crystal-pulling apparatus for pulling and growing a silicon crystal from a melt in accordance with the first preferred embodiment of the present invention. The apparatus 10 of the present embodiment comprises a chamber 11 in which a quartz crucible 13 that reserves a silicon melt 12 is placed. The outer surface of the quartz crucible 13 is covered with a graphite supporter 14. The underside of the quartz crucible 13 is coaxially fixed on the top end of a supporting axis 16 through the graphite supporter 14, while the bottom end of the supporting axis 16 is connected to a driving mechanism 17 having a first rotary motor (not shown) that imparts a rotary motion to the quartz crucible 13 and an up-and-down motor (not shown) that imparts an up-and-down motion to the quartz crucible 13. Therefore, the quartz crucible 13 is able to rotate in a predetermined direction in addition to move up and down. The outer surface of the quartz crucible 13 is surrounded by a heater 18 with a predetermined space therebetween. Furthermore, the heater 18 is surrounded by a thermal-insulating cylinder 19. For preparing a silicon melt 12, the heater 18 is responsible for heating and melting the entire silicon polycrystalline material of high purity placed in the quartz crucible 13.

The top end of the chamber 11 is connected to a cylindrical casing 21 on which a pulling member 22 is provided. The pulling member 22 comprises: a pulling. head (not shown) pivotably arranged in a horizontal position on the top end of the casing 21; a second rotary motor (not shown) for rotating the pulling head; a wire cable 23 hanging down from the head to the rotation center of the quartz crucible 13; and a pulling motor (not shown) installed in the head for winding up or unwinding the wire cable 23. A seed of the crystal 24 is attached to the lower end of the wire cable 23 for dipping the seed 24 into the melt 12 and then slowly pulling the seed 24 from the melt 12. The crystal being pulled is rotated to ensure uniform crystal growth to obtain a silicon monocrystal ingot 25.

Furthermore, the chamber 11 is connected to a gas-feeding and discharging member 28 that feeds an inert gas to the side of the silicon monocrystal ingot 25 in the chamber 11 and discharges the inert gas from the side of the inner peripheral surface of the quartz crucible 13 in the chamber 11. The gas-feeding and discharging member 28 comprises a feed pipe 29 and a discharge pipe 30. The feed pipe 29 has one end that communicates with the interior of the chamber 11 through a peripheral wall of the casing 21 and the other end that connects with a tank (not shown) for reserving the inert gas described above. On the other hand, the discharge pipe 30 has one end that communicates with the interior of the camber 11 through the bottom of the chamber 11 and the other end that connects with a vacuum pump (not shown).

Both the feed and discharge pipes 29, 30 are equipped with first and second flow-regulating valves 31, 32, respectively, for regulating the quantity of the inert gas that passes through these pipes 29, 30.

An output shaft (not shown) of the pulling motor is equipped with a rotary encoder (not shown), while the driving mechanism 17 is equipped with a weight sensor (not shown) and a liner encoder (not shown). The weight sensor detects a weight of the silicon melt 12 in the quartz crucible 13 and the linear encoder detects a position of the supporting axis 16 during its up-and-down movement. Detection outputs of the rotary encoder, the weight sensor, and the linear encoder are connected to control inputs of a controller (not shown), respectively. Also, control outputs of the controller are connected to the pulling motor of the pulling member 22 and the up-and-down motor of the driving mechanism, respectively. Furthermore, the controller has a memory (not shown) that stores a first map and a second map. The first map includes data of a length of the wire cable 23 to be wound with respect the detection output of the rotary encoder (i.e., a length of the silicon monocrystal ingot 25 to be formed by pulling the crystal from the silicon melt 12). On the other hand, the second map includes data of the liquid level of the silicon melt 12 in the quartz crucible 13 with respect the detection output of the weight sensor. For keeping the level of the silicon melt 12 in the quartz crucible 13, the controller is configured to control the up-an-down motor of the crucible driving means 17, based on the detection signal of the weight sensor.

A thermal shield device 36 is positioned between the outer peripheral surface of the silicon monocrystal ingot 25 and the inner peripheral surface of the quartz crucible 13 so that the ingot 25 is enclosed with the thermal shield device 36. The thermal shield device 36 comprises: a tubular part 37 for preventing the radiation heat from the cylindrical-shaped heater 18; and a flange portion 38 connected to the upper edge of the tubular part 37 and protruded outwardly almost in the horizontal direction. The flange portion 38 is mounted on the heat-insulating tubular part 19 to secure the thermal shield device 36 in the chamber 11. The thermal shield device 38 is made of a material selected from molybdenum (Mo), tungsten (W), and carbon (C), graphite coated with SiC, or the like. The tubular part 37 may be of having the same diameter of any part along its axis. Alternatively, the tubular part 37 may be provided as a tapered structure with a gradual decrease in its diameter. In this embodiment, furthermore, the tubular part is configured so as to satisfy that the relationship among the outer diameter "D1" of the lower end of the tubular part 37, the inner diameter "D2" of the quartz crucible 13, and the diameter "d" of the silicon monocrystal ingot is represented as $1.65d < D1 < D2$.

Figure 2:
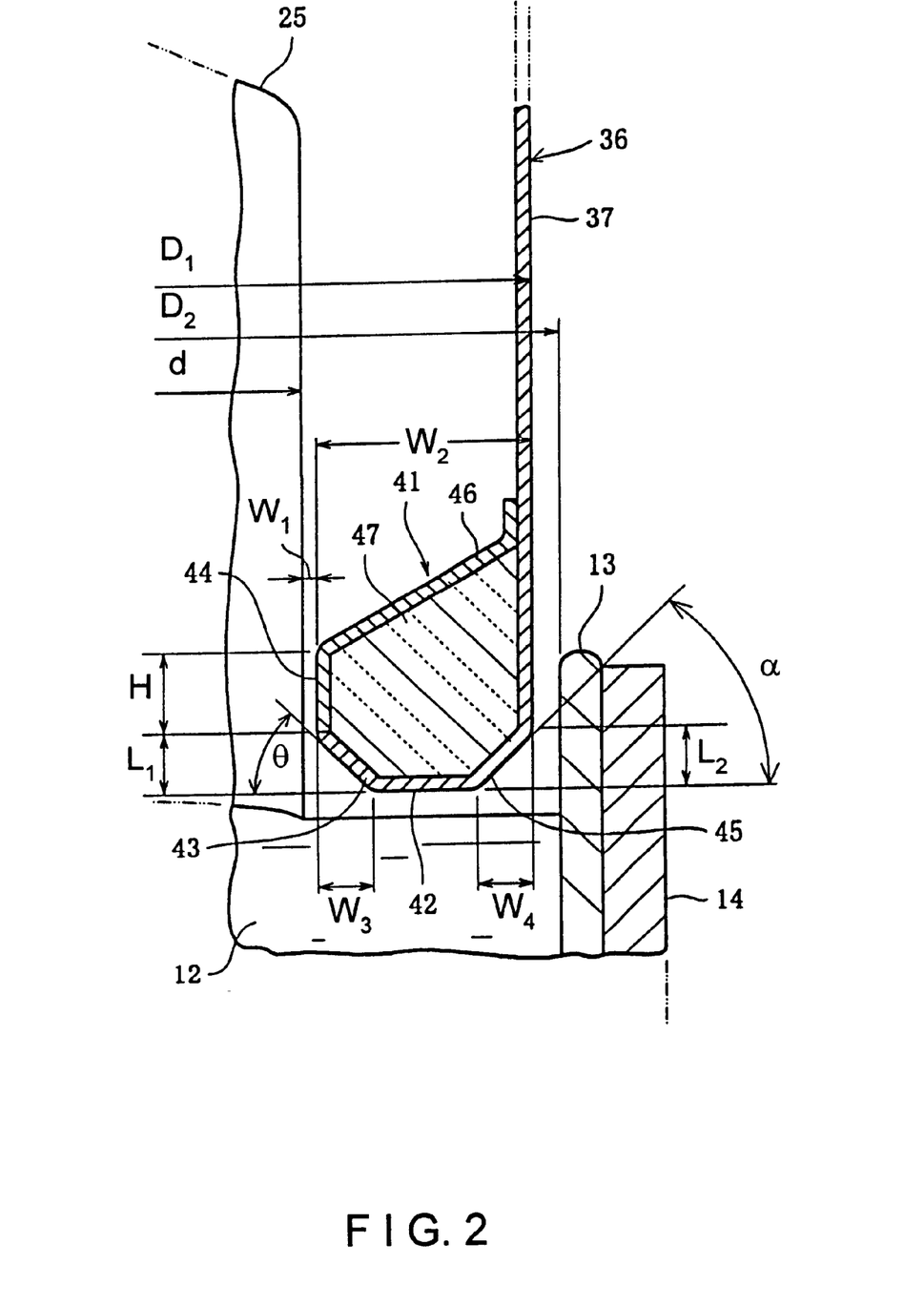
FIG. 2 is an enlarged cross sectional view of a part (indicated by the arrow "A" in FIG. 1) of a thermal shield device of the crystal-pulling apparatus shown in FIG. 1.

The tubular part 37 shown in FIG. 2 is of having the same diameter of any part along its axis and includes an inwardly protruding part 41 formed along the edge of its bottom end. The protruding part 41 comprises a bottom wall 42, a vertical wall 44, and a top wall 46. The bottom wall 42 is formed like a ring in plan view as if it will fit on the crystal to be grown. As shown in the figure, an outer edge of the ring-shaped bottom wall 42 is connected to the bottom edge of the tubular part 37 and horizontally extends to the proximity of the outer peripheral surface of the silicon monocrystal ingot 25. On the other hand, the inner edge of the bottom wall 42 is connected to the vertical wall 44. The top wall 46 is extended like the surface of a truncated cone with a gradual increase in diameter in an upward direction. As shown in the figure, an inclined inner wall 43 is provided as an intersection between the vertical wall 44 and the bottom wall 42. The inclined inner wall 43 is also extended like the surface of a truncated cone with a gradual decrease in diameter in an upward direction. On the other hand, an inclined outer wall 45 is provided as an intersection between the tubular part 37 and the bottom wall 42. The inclined outer wall 45 is extended like the surface of a truncated cone with a gradual increase in diameter in a downward direction. The inclinations θ and α of the respective inner and inclined outer walls 43, 45 are nor greater than 80 degrees, and preferably in the range of 5 to 30 degrees with respect to the underside of the bottom wall 42.

In this embodiment, the tubular part 37 and those walls 42, 43, and 45 are formed as a single-piece construction. The inner and inclined outer walls 43, 45 are configured so as to satisfy the following conditions, respectively. That is, the relationship between a diameter "d" of the silicon monocrystal ingot 25 to be pulled and a vertical distance "L1" from the bottom edge of the vertical wall 44 to the underside of the bottom wall 32 is represented by $0 < L1 < d/2$. Also, the relationship between "d" and a vertical distance "L2" from the bottom edge of the tubular part 37 to the underside of the bottom wall 32 is represented by $0 < L2 < d/2$. Furthermore, the spacing "W1" between the outer peripheral surface of the silicon monocrystal ingot 25 and the vertical wall 44 is in the range of 10 mm to 30 mm and preferably of 15 mm to 20 mm. In this case, it is preferable that a width "W2" of the protruding part 41 is 50 mm or over. A horizontal spacing "W3" between the inner side of the vertical wall 44 and an inner edge of the bottom wall 42 is over 0 mm but less than the width "W2" of the protruding part 41. Similarly, a horizontal spacing "W4" between the outer peripheral surface of the tubular part 37 and an outer edge of the bottom wall 42 is over 0 mm but less than the width "W2" of the protruding part 41.

The vertical wall 44 is formed to have a height of 10 to 100 mm and extended in parallel to an axis of the silicon monocrystal ingot 25 or alternatively inclined at any angle of –30 to +30 degrees with respect to that axis. In the latter case, "–30 degrees" means that the vertical wall 44 extends upward with a gradual decrease in diameter at an angle of 30 degrees with respect to the axis, and "+30 degrees" means that the vertical wall 44 extends upward with a gradual increase in diameter at an angle of 30 degrees with respect to the axis. In this embodiment, it is preferable that the vertical wall 44 extends in parallel to the axis of the silicon monocrystal ingot 25. In other words, it is preferable to make the vertical wall so as to be extend in the vertical direction. By the way, the vertical distances L1, L2, the spacing W1, and the height H described above are appropriately defined in accordance with a diameter of the silicon monocrystal ingot 25 to be obtained. The cone-shaped top wall 46 is formed so that its diameter is gradually increased in an upward direction. In addition, the top edge of the wall 46 makes contact with the inner peripheral surface of the tubular portion 37. The inside of the protruding part 41 is enclosed with the lower part of the tubular portion 37, the bottom wall 42, the vertical wall 44, and the top wall 46 to form a closed space in which a thermal-insulating member 47 such as a felt material made of carbon fibers is filled. The vertical wall 44 and the top wall 46 are formed as a single-piece construction to be fixed to the inclined inner wall 43 and the tubular portion 37 by screws or pins after filling the thermal-insulating member 47 into the space defined by the lower part of the cylindrical portion 37, the inclined outer wall 25, the bottom wall 42, and the inclined inner wall 43.

Hereinafter, the operation characteristics of the crystal-pulling apparatus thus constructed for pulling a silicon monocrystal will be described.

In the conventional crystal-pulling apparatus, as described above, the nonuniform distribution of temperature in a portion of the silicon monocrystal ingot 25 in proximity to the silicon melt 12 can be observed when it is gradually pulled from the silicon melt 12. That is, the maximum temperature can be observed in the center of such a portion, while the temperature is gradually decreased from the center to the outside in a radius direction of the ingot 25. A sudden decrease in temperature can be also observed on the outer periphery of that portion because of a large amount of heat radiation from the outer peripheral surface of the silicon monocrystal ingot 25.

In this embodiment, however, such a trouble can be avoided as follows. The thermal shield device 36 having the protruding part 41 encircles the silicon monocrystal ingot 25 being pulled from the silicon melt 12. Specifically, the inclined inner wall 43 and the vertical wall 44 of the protruding part 41 are in the place where the part of the silicon monocrystal ingot 25 has just come out from the surface of the melt 25, so that the remarkable radiation of heat from the outer peripheral surface of such a part of the ingot 25 can be prevented. That is, the radiation of heat from the outer peripheral surface of the silicon monocrystal ingot 25 can be reflected by the inclined inner wall 43 and the vertical wall 44 of the protruding part 41 which are positioned in close proximity to that surface. In addition, the temperature of the protruding part 41 is considerably increased by the heat radiation from the high-temperature silicon melt 12. Consequently, the drastic decrease in the temperature of the outer peripheral portion of the silicon monocrystal ingot 25 can be prevented and the distribution of temperature from the center to the outer peripheral portion can be substantially uniformed. In other words, the crystal-pulling apparatus of the present embodiment allows a vertical thermal gradient in the silicon monocrystal ingot 25 where the radial distribution of temperature in any part thereof is substantially uniform, so that the slip generation and first dislocation generation in the resulting product can be prevented as a result of the prevention of thermal stress to be applied in the silicon monocrystal ingot 25.

Figure 3:
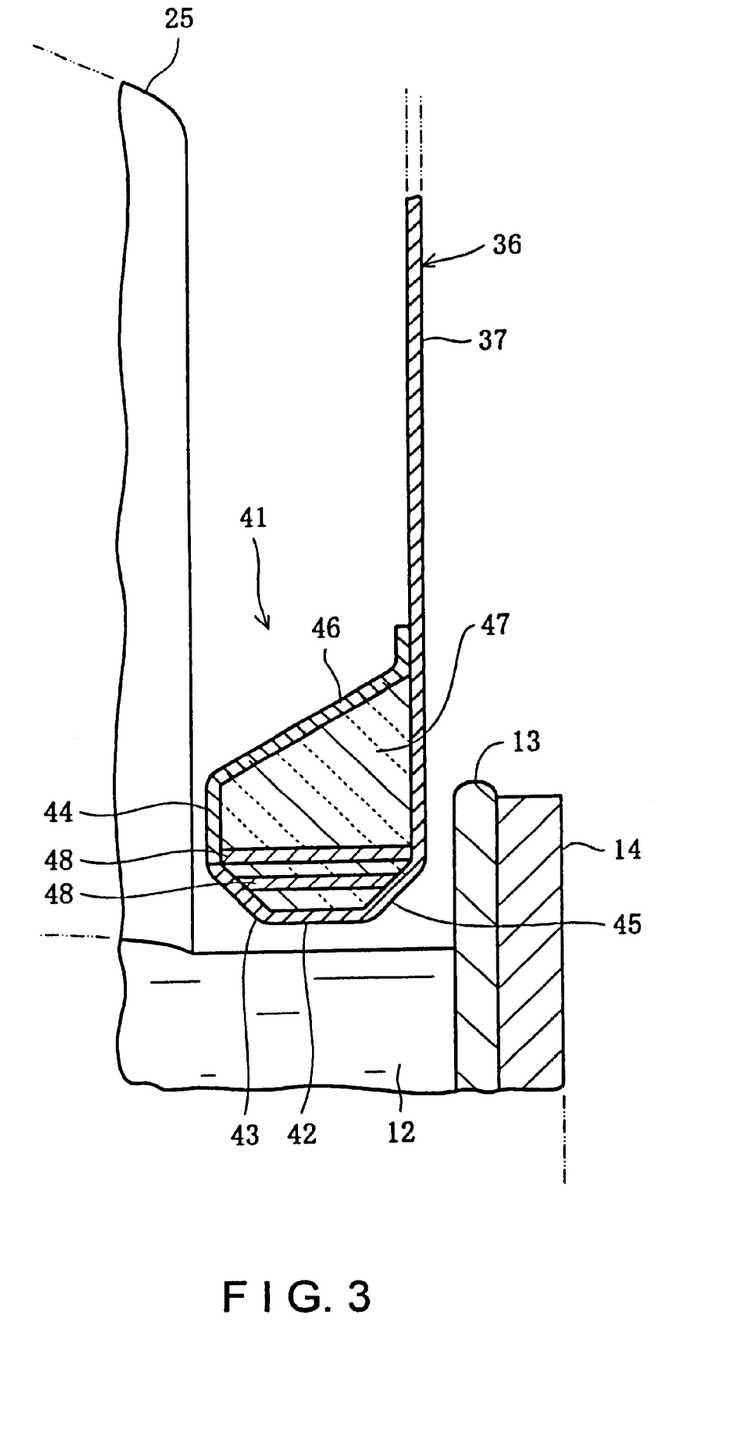
FIG. 3 is a cross sectional view of a part of a thermal shield device of a crystal-pulling apparatus for pulling and growing a silicon crystal from a melt in accordance with another preferred embodiment of the present invention.

Referring now to FIG. 3, there is shown a thermal shield device 36 of a crystal-pulling apparatus for pulling a silicon monocrystal from a melt in accordance with a second preferred embodiment of the present invention. In this figure, the same reference numerals as those in FIG. 3 denote the same components as those in FIG. 2.

In this embodiment, two ring-shaped heat transfer members 48 are situated in the protruding part 41 so that an outer edge of each member 48 is connected to the tubular part 37 or the inclined outer wall 45 while an inner edge thereof is connected to the vertical wall 44 or the inclined inner wall 43. At the time the thermal-insulating member 47 is filled in the protruding part 41, the heat transfer members 48 are also placed in the protruding part 41 with the thermal-insulating member 47. That is, the heat transfer members 48 are placed in the space defined by the lower portion of the tubular part 37, the inclined outer wall 45, the bottom wall 42, and the inclined inner wall 43, and then the vertical wall 44 and the top wall 46 which are molded in one piece are affixed to the inclined inner wall 43 and the tubular part 37 with screws or pins. Therefore, the heat transfer members 48 traverse the inside of the protruding part 41, where the outer peripheral edge of each of them is connected to the tubular part 37 and the inner edge of each of them is connected to the vertical wall 44 or the inclined inner wall 43.

The thermal shield device 36 constructed as described above inhibits the steep decrease in temperature of the outer peripheral portion of the silicon monocrystal ingot 25. During the process of pulling a silicon crystal from a melt, the vertical wall 44 or the inclined inner wall 43 is heated by radiant heat from the inner peripheral wall of the quartz crucible 13 or by heat from the heater 18. In this case, the crystal-pulling apparatus of the present embodiment allows an effective increase in the temperatures of both the vertical wall 44 and the inclined inner wall 43 by conducting heat from the tubular part 37 or the inclined outer wall 45 to the vertical wall 44 or the inclined inner wall 43 through the heat transfer members 48. Thus, the vertical wall 44 or the inclined inner wall 43 being raised in temperature relieves heat radiation from the silicon monocrystal ingot 25 to prevent the steep decrease in temperature of the outer peripheral portion of the silicon monocrystal ingot 25. By the way, the thickness of each heat transfer member 48 may be depended on the number of the heat transfer members 48. Preferably, however, it may be in the range of 6 to 9 mm. Further details of the operation characteristics of the crystal-pulling apparatus of the present embodiment are almost the same as those of the first embodiment, so that the repeating description is omitted.

Figure 4:
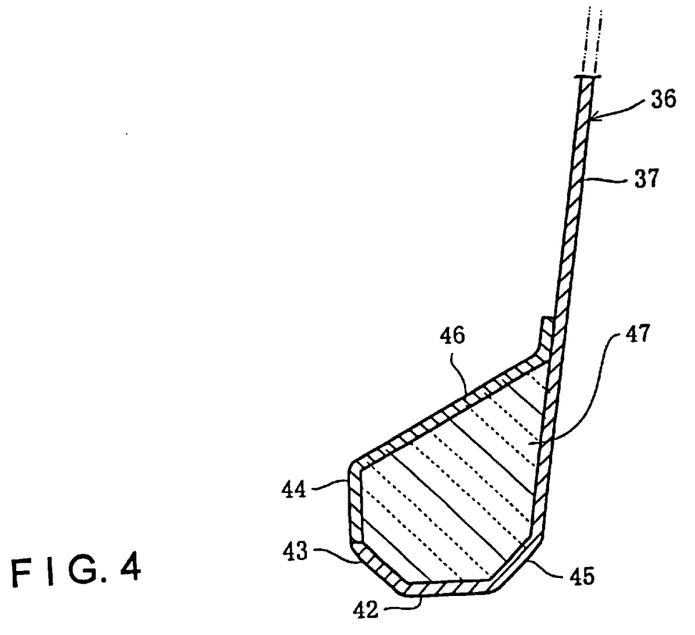
FIG. 4 is a cross sectional view of a thermal shield device having a tubular member with a gradual decrease in diameter toward its lower end.
Figure 5:
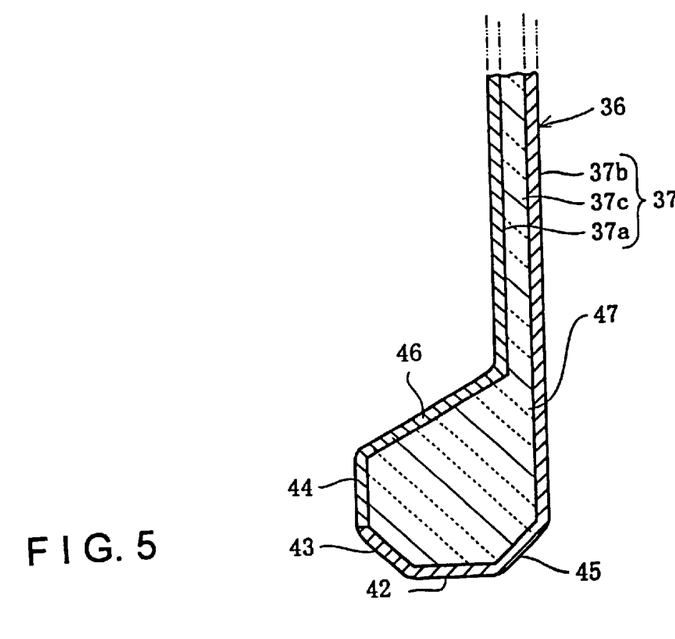
FIG. 5 is a cross sectional view of a thermal shield device having a tubular member being filled with a heat insulating material.

In the above embodiments, by the way, the tubular part 37 of the thermal shield device 36 is in the shape of a cylindrical tube. As shown in FIG. 4, however, it may be a hollow body in the shape of a circular truncated cone with a gradual decrease in diameter to become gradually narrower in a downward direction. In this case, the space between the outer peripheral portion of the silicon monocrystal ingot 25 and the outer peripheral surface of the tubular part 37 becomes gradually broader toward the silicon melt 12, so that an inert gas downwardly passing through such a space can be smoothly introduced into the space between the silicon melt 12 and the protruding part 41. As shown in FIG. 5, alternatively, the tubular part 37 may comprise an inner tubular part 37a, an outer tubular part 37b, and heat insulating material 37c filled in the space between the inner and outer tubular parts 37a, 37b. The heat insulating material 37c provided in a double-wall structure of the tubular body 37 restrains the radiant heat from the inner peripheral wall of the quartz crucible 13 toward the silicon monocrystal ingot 25.

Figure 6:
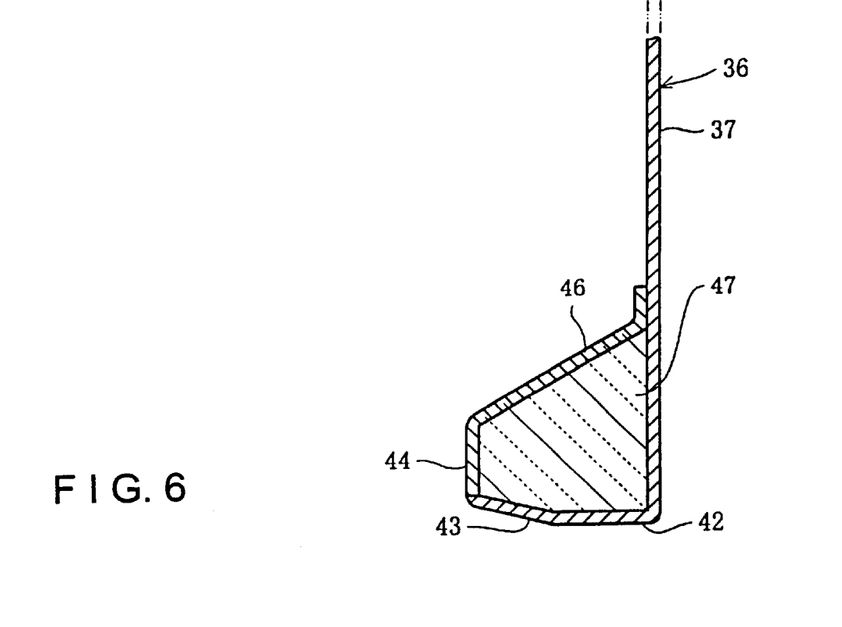
FIG. 6 is a cross sectional view of a thermal shield device having a tubular member, where a protruding part of the tubular member includes a comparatively large sized inner wall but not having an outer wall portion.
Figure 7:
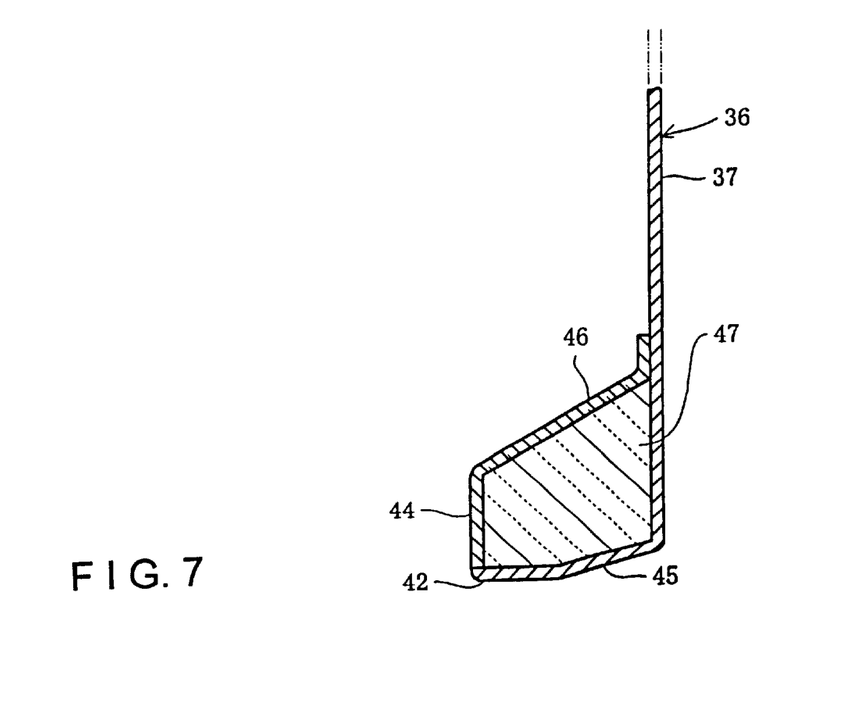
FIG. 7 is a cross sectional view of a thermal shield device having a tubular member, where a protruding part of the tubular member includes a comparatively large sized outer wall portion but not having an inner wall portion.
Figure 8:
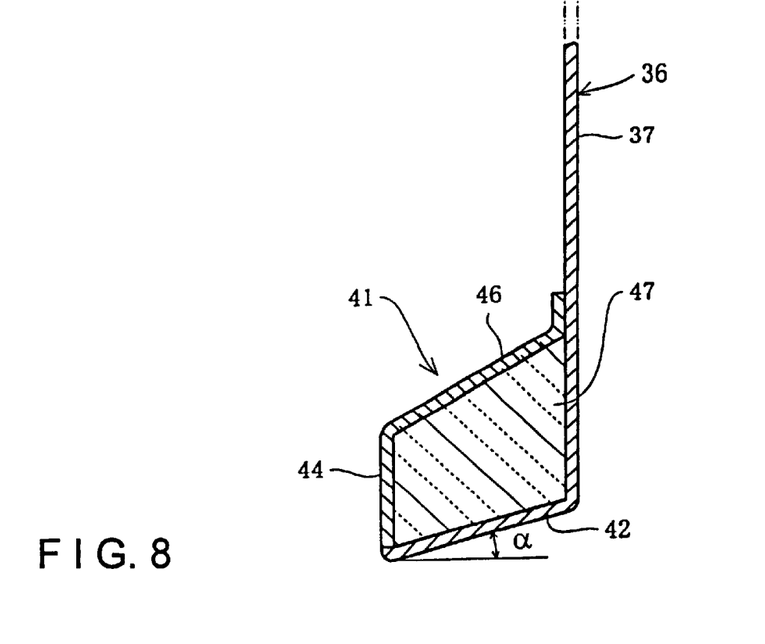
FIG. 8 is a cross sectional view of a thermal shield device having a tubular member, where a protruding part of the tubular member does not have both inclined inner and outer walls and is shaped like a cone with a gradual decrease in diameter downwardly along a bottom wall.
Figure 9:
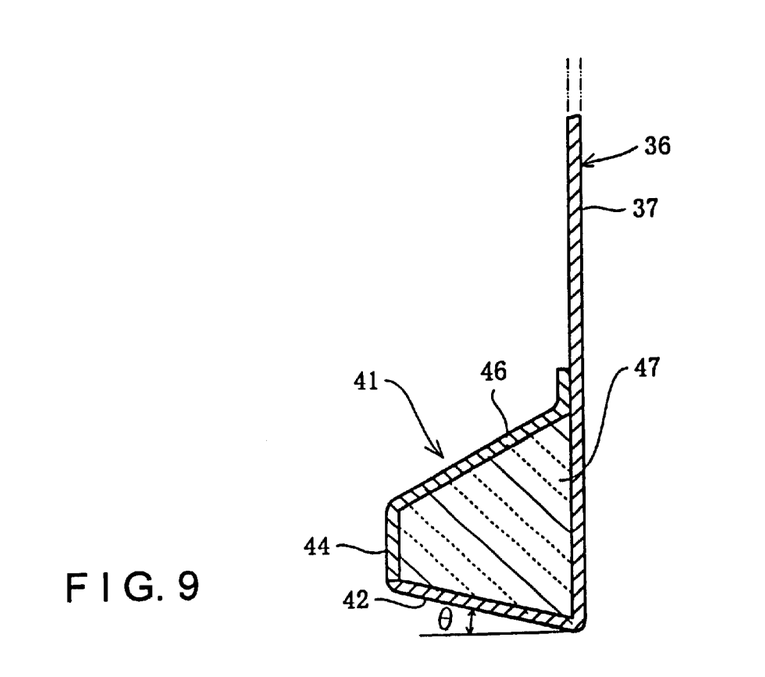
FIG. 9 is a cross sectional view of a thermal shield device having a tubular member, where a protruding part of the tubular member does not have both inclined internal and outer walls and is shaped like a cone with a gradual decrease in diameter upwardly along a bottom wall.
Figure 10:
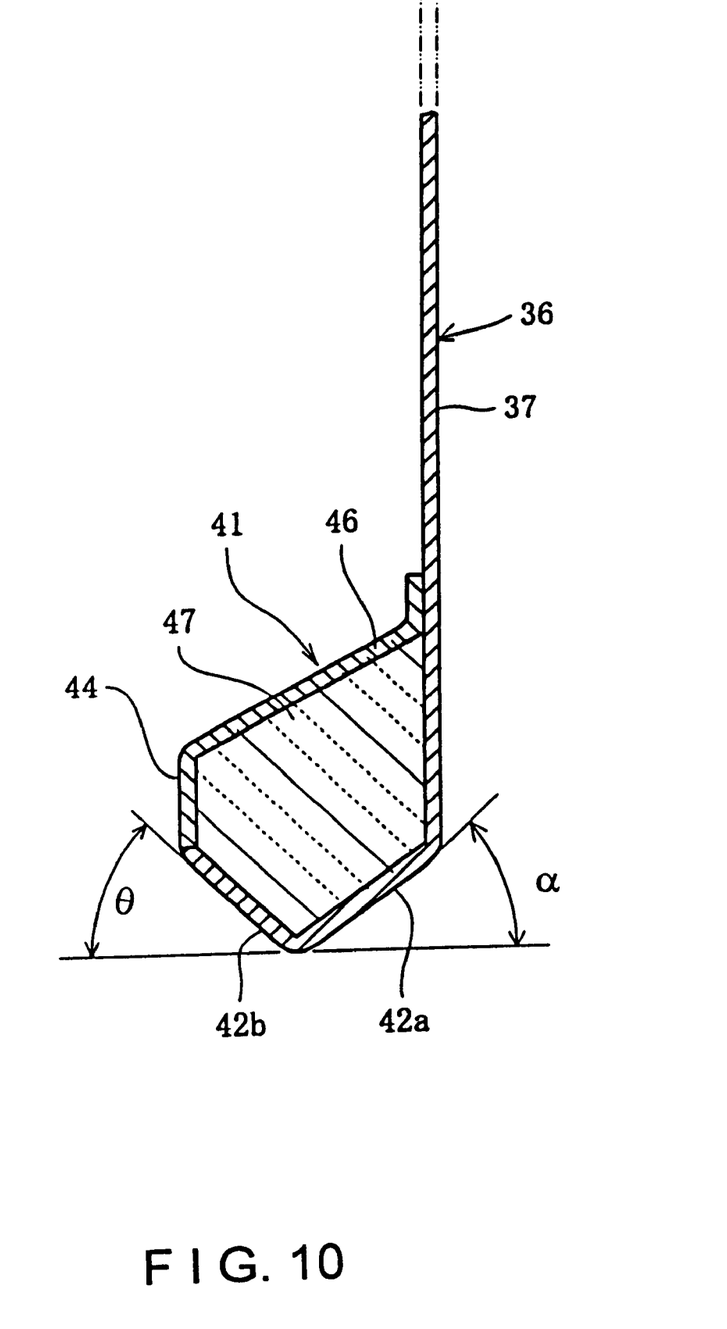
FIG. 10 is a cross sectional view of a thermal shield device having both outer and inner bottom walls.

The above embodiments, furthermore, the inclined inner wall 43 is provided between the vertical wall 44 and the bottom wall 42 and also the inclined outer wall 45 is provided between the tubular part 47 and the bottom wall 42. As shown in FIG. 6, however, the inclined inner wall 45 may b only provided between the vertical wall 44 and the bottom wall 42 without proving the inclined outer wall. As shown in FIG. 7, alternatively, the inclined outer peripheral wall 45 may be only provided between the tubular part 37 and the bottom wall 42 without proving the inclined inner wall. Further alternatively, the bottom wall itself may be shaped like a cone having an outer edge connecting to the under edge of the tubular part 37 and an inner edge extending to the proximity of the outer peripheral surface of the silicon monocrystal ingot without providing both the inclined inner and outer walls 43, 45. As shown in FIG. 8, the bottom wall 42 may be inclined at an angle $\alpha$ of 80 degrees or less ($\alpha$>0) with respect to a horizontal plane, gradually decreasing in diameter in a downward direction. As shown in FIG. 9, alternatively, the bottom wall 42 may be inclined at an angle $\theta$ of 80 degrees or less ($\theta$>0) with respect to a horizontal plane, gradually decreasing in diameter in an upward direction.

Additionally, the bottom wall may be shaped like a cone as if it is provided as a combination of the configurations shown in FIG. 8 and FIG. 9. That is, the bottom wall 42 may comprise an outer bottom wall 42a with its edge connecting to the tubular part 36 and an inner bottom wall 42b with its edge connecting to the vertical member 44. The outer bottom wall 42a may be inclined at an angle α of 80 degrees or less (α>0) with respect to a horizontal plane, gradually decreasing in diameter in a downward direction. On the other hand, the inner bottom wall 42b may be inclined at an angle θ of 80 degrees or less (θ>0) with respect to a horizontal plane, gradually decreasing in diameter in an upward direction. Any thermal shield devices shown in FIGS. 4 to 10 are able to prevent the steep decrease in temperatures of the outer peripheral portion of the silicon monocrystal ingot 25 by reflecting the heat radiation from the ingot 25 on the vertical wall 44 of the protruding part 41 or increasing the temperature of the protruding part 41 with the high-temperature heater 18 and the silicon melt.

Hereinafter, concrete examples of the present invention and the comparative examples will be explained in detail.

EXAMPLE 1

A thermal shield device 36 of a crystal-pulling apparatus for pulling a silicon crystal from a silicon melt, having the same configuration as shown in FIGS. 1 and 2, was constructed as follows.

A tubular part 37 of the thermal shield device 36 had an inner diameter of 410 mm and a height of 420 mm. A protruding part 41 comprising an inclined outer wall 45, a bottom wall 43, an inclined inner wall 43, a vertical wall 44, an a top wall 46 was formed on the lower end portion of the tubular part 37. The protruding part 41 was provided as a tubular structure in which the vertical wall 44 had an inclination of zero (i.e., parallel to the peripheral surface of the tubular part 37), an inner diameter of 250 mm, and a height of 40 mm. A lower end of the inclined inner wall 43 was formed so as to have an inner diameter of 330 mm, an inclination "α" of 45 degrees, and a vertical distance "L" of 40 mm. Furthermore, the space between an under surface of the bottom wall 42 and a surface of the silicon melt 12 was 35 mm, while the space "W1" between the vertical wall 44 was 20 mm. In this example, furthermore, all of the structural components 37, 45, 42, 43, 44, and 46 were made of a carbon material. Therefore, the heat shield member thus obtained was equipped in the crystal-pulling apparatus for pulling a silicon crystal from a melt and such a crystal-pulling apparatus was referred to as Example 1 to be subjected to the comparative test and the evaluation described below.

EXAMPLE 2

A thermal shield device 36 of a crystal-pulling apparatus for pulling a silicon crystal from a silicon melt, having the same configuration as shown in FIG. 3, was constructed as the same way as that of Example 1 except of the follows. That is, two ring-shaped heat transfer members 48 were provided so that they traversed the inside of a protruding part 41, where the outer peripheral edge of each of them was connected to a tubular part 37 and the inner edge of each of them was connected to an inclined inner wall 43. Therefore, the heat shield member thus obtained was equipped in the crystal-pulling apparatus for pulling a silicon crystal from a melt and such a crystal-pulling apparatus was referred to as Example 2 to be subjected to the comparative test and the evaluation described below.

Comparative Example 1

A thermal shield device 36 of a crystal-pulling apparatus for pulling a silicon crystal from a silicon melt was constructed as the same way as that of Example 1 except that a protruding part 41 was not provided on the lower end portion of a tubular part 37 (not shown in the figure). Therefore, the heat shield member thus obtained was equipped in the crystal-pulling apparatus for pulling a silicon crystal from a melt and such a crystal-pulling apparatus was referred to as Comparative Example 1 to be subjected to the comparative test and the evaluation described below.

Comparative Test and Evaluation

A computer simulation was down using a heat-conductive analytical program.

First, the computer simulated the following conditions. That is, each of the crystal-pulling apparatuses of Example 1, Example 2, and Comparative Example 1 was used to pull a silicon monocrystal ingot with a diameter of 210 mm from a silicon melt. At the time the top of the ingot was pulled 400 mm from a surface of the melt, the distribution of temperature in the silicon monocrystal ingot was simulated and calculated using the heat-conduction analytical program. Then, the computer calculate the changes in G/Gc with respect to the distance from the center of the silicon monocrystal ingot toward the outer peripheral surface thereof in a radial direction. In this case, "G" denotes a mean value of the vertical distribution of temperature with respect to each part of the silicon monocrystal ingot at a height of up to 30 mm from the surface of the silicon melt. Also, "Gc" denotes a mean value of the vertical distribution of temperature with respect to the center of the silicon monocrystal ingot at a height of up to 30 mm from the surface of the silicon melt. The results obtained by the above calculation were plotted in FIG. 11.

Figure 11:
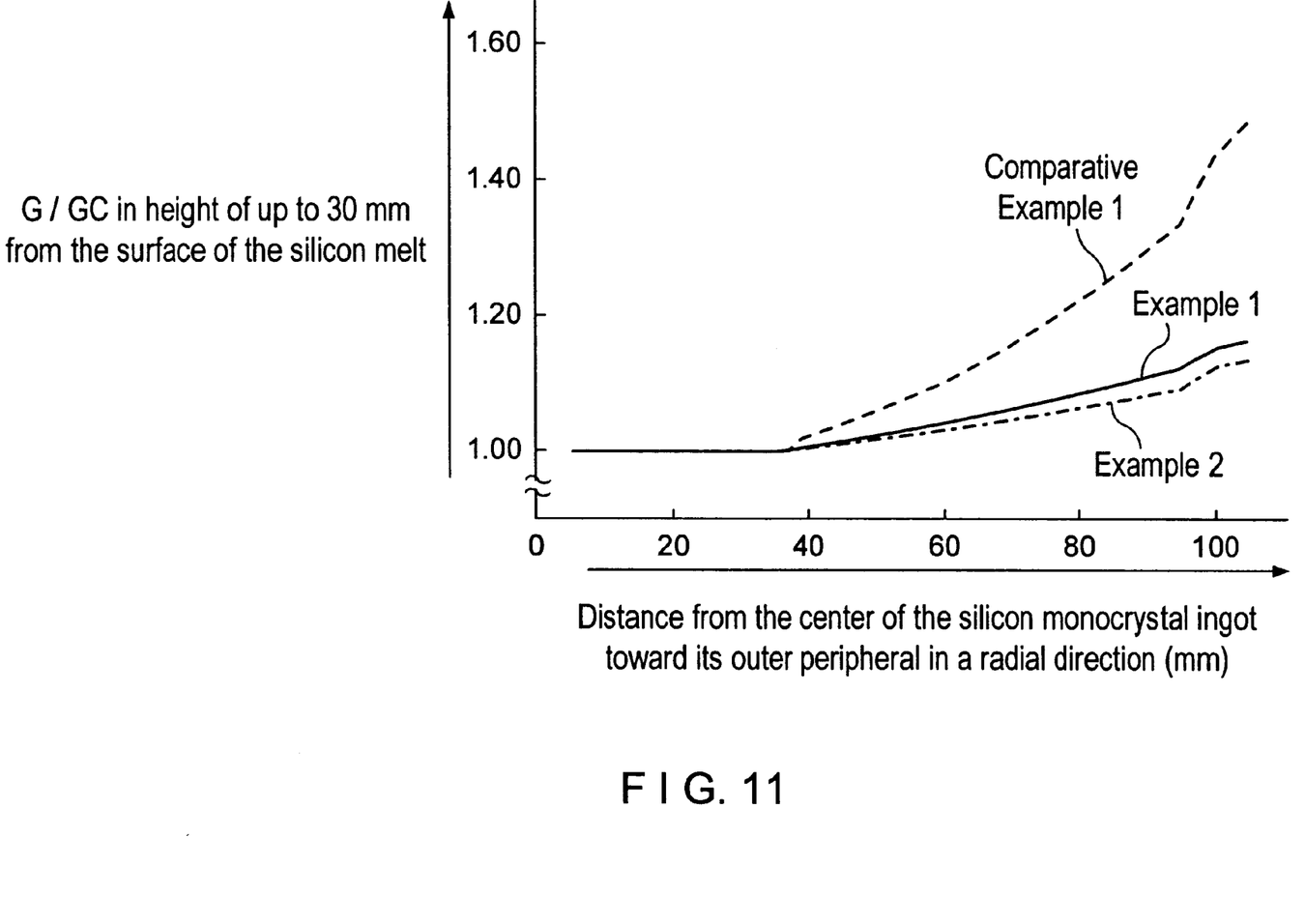
FIG. 11 is a graph that illustrates the change in G/Gc with respect to the radial distance from the center of a silicon monocrystal ingot, where "G" denotes the mean value of a temperature gradient along the outer periphery of the silicon monocrystal ingot in a vertical direction from the surface of a silicon melt to a height of 30 mm above the melt and "Gc" denotes the mean value of a temperature gradient along the center of the silicon monocrystal ingot in a vertical direction from the surface of a silicon melt to a height of 30 mm above the melt.

As is evident from FIG. 11, curves formed by plotting the obtained G/Gc values of Example 1 and Example 2 were gentle slopes as compared with that of Comparative Example 1. Regarding each of Example 1 and Example 2, furthermore, the steep change in the G/Gc value at the outer peripheral surface of the silicon monocrystal ingot could not be observed. That is, the radial distribution of temperature in the vertical temperature gradient became almost uniform. Each of Example 1 and Example 2 is able to prevent the steep decrease in temperatures of the outer peripheral portion of the silicon monocrystal ingot by reflecting the heat radiation from the ingot on the vertical wall of the protruding part 41 or increasing the temperature of the protruding part 41 with the high-temperature heater 18 and the silicon melt.

In addition, the radial distribution of temperature in the vertical temperature gradient of Example 2 became more uniform than that of Example 1.

In this case, it is conceivable that the crystal-pulling apparatus of Example 2 allows an effective increase in the temperatures of both the vertical wall 44 and the inclined inner wall 43 by conducting heat from the tubular part 37 or the inclined outer wall 45 to the vertical wall 44 or the inclined inner wall 43 through the heat transfer members 48. Thus, the vertical wall 44 or the inclined inner wall 43 being raised in temperature further prevents the heat radiation from the silicon monocrystal ingot 25 to avoid the steep decrease in temperature of the outer peripheral portion of the silicon monocrystal ingot 25.

According to the present invention, as described above, the advantages of the invention consist in the fact that a thermal shield device is constructed to have a protruding part formed on a lower portion of a tubular part and filled with a thermal-insulating member. The protruding part protrudes in an inward direction and has a bottom wall facing to the silicon melt. The protruding part may be comprised of a bottom wall, a vertical wall, and a top wall. The bottom wall may be shaped like a ring or cone having an outer edge connected to a lower edge of the tubular part. The bottom wall may extend horizontally or with a predetermined inclination to the proximity of an outer peripheral surface of the silicon monocrystal ingot. The vertical wall may be positioned at a predetermined distance from the outer peripheral surface of the silicon monocrystal ingot and connected to an inner edge of the bottom wall. The vertical wall may extend in parallel to an axis of the silicon monocrystal ingot or extending at a predetermined angle with respect to the axis of the silicon monocrystal ingot. The top wall may have a lower edge connected to an upper edge of the vertical wall and an upper edge attached to an inner peripheral surface of the tubular part. The top wall may extend in an upward direction with a gradual increase in diameter. Therefore, the heat radiation from the outer peripheral surface of the silicon monocrystal ingot can be reflected by the vertical wall of the protruding part or prevented by the temperature of the protruding part which is considerably increased by the heat radiation from the high-temperature silicon melt. Thus, the configuration of the protruding part prevents the steep decrease in temperatures of the outer peripheral portion of the silicon monocrystal ingot. Consequently, the distribution of temperature from the center to the outer peripheral portion of such an ingot can be substantially uniformed. In addition, the protruding part allows a vertical thermal gradient in the silicon monocrystal ingot where the radial distribution of temperature in any part thereof is substantially uniform. Thus, the slip generation and first dislocation generation in the resulting product can be prevented as a result of the prevention of thermal stress to be applied in the silicon monocrystal ingot.

Furthermore, it is advantageous that an inclined inner wall extending in an upward direction with a gradual decrease in diameter is formed as an intersection between the vertical wall and the bottom wall. In this case, the heat radiation from the outer peripheral surface of the silicon monocrystal ingot can be reflected by the inclined inner wall. As a result, the steep decrease in temperature of the outer peripheral portion of the silicon monocrystal ingot, especially in temperature of the proximity to the solid-liquid interface of such an ingot can be prevented. Alternatively, a cone-shaped inclined outer wall extending in a downward direction with a gradual decrease in diameter may be formed as an intersection between the tubular part and the bottom wall. In this case, the heat radiation from the silicon melt or the quartz crucible can be reflected by the inclined inner wall. As a result, the temperature of the protruding part can be further increased.

It is also advantageous that the spacing between the outer peripheral surface of the silicon monocrystal ingot and the vertical wall is in the range of 10 mm to 30 mm. In this case, the heat radiation from such an ingot can be effectively reflected without contacting between them.

It is advantageous that at least one ring-shaped heat transfer member having an outer peripheral edge connected to the tubular part or the inclined outer wall and an inner peripheral edge connected to the vertical wall or the inclined inner wall is transversely formed in the inside of the protruding part. In this case, the configuration allows an effective increase in the temperatures of both the vertical wall and the inclined inner wall by conducting heat from the tubular part or the inclined outer wall being heated by radiant heat from the inner peripheral wall of the quartz crucible or by heat from the heater to the vertical wall or the inclined inner wall through the heat transfer members. Thus, the vertical wall or the inclined inner wall being raised in temperature further relieves heat radiation from the silicon monocrystal ingot to prevent the steep decrease in temperature of the outer peripheral portion of the silicon monocrystal ingot. Consequently, the generation of thermal stress in the silicon monocrystal ingot can be effectively prevented as the steep decrease in temperature of the outer peripheral surface of the silicon monocrystal ingot being pulled from a silicon melt can be suppressed by the comparatively high-temperature protruding part.

The present invention has been described in detail with respect to preferred embodiments, and it will be obvious to those skilled in the art that changes and modifications may be made without departing from the invention in its broader aspects, and it is the intention, therefore, in the appended claims to cover all such changes and modifications as fall within the true spirit of the invention.

What is claimed is:

1. A thermal shield device equipped in a crystal-pulling apparatus for pulling a silicon monocrystal ingot from a silicon melt reserved in a quartz crucible having an outer peripheral surface encircled with a heater, comprising:

a tubular part to be used for surrounding a silicon monocrystal ingot being pulled and grown in an upward direction to prevent radiant heat from the heater toward the silicon monocrystal ingot, having a lower end positioned above a surface of the silicon melt with a space therebetween; and a protruding part formed on a lower portion of the tubular part and filled with a thermal-insulating member, which protrudes in an inward direction and has a bottom wall facing to the silicon melt;

wherein the bottom wall has a shape of a ring having an outer edge connected to a lower edge of the tubular part, extending horizontally to the proximity of an outer peripheral surface of the silicon monocrystal ingot; and the protruding part includes a vertical wall positioned at a distance from the outer peripheral surface of the silicon monocrystal ingot and connected to an inner edge of the bottom wall, extending in parallel to an axis of the silicon monocrystal ingot or extending at an angle of −30 to +30 degrees with respect to the axis of the silicon monocrystal ingot, and a cone-shaped top wall having a lower edge connected to an upper edge of the vertical wall and an upper edge attached to an inner peripheral surface of the tubular part, extending in an upward direction with a gradual increase in diameter.

2. A thermal shield device according to claim 1, wherein an inclined inner wall extending in an upward direction with a gradual decrease in diameter is formed as an intersection between the vertical wall and the bottom wall and inclined at an angle of 80 degrees or less but not zero with respect to an under surface of the bottom wall so as to satisfy that the relationship between the diameter "d" of the silicon monocrystal ingot and the vertical distance L1 from the lower edge of the vertical wall to the under surface of the bottom wall is represented as $0 \leq L1 \leq d/2$.

3. A thermal shield device according to claim 2, wherein the height "H" of the vertical wall is in the range of 10 mm to d/2 where "d" is the diameter of the silicon monocrystal ingot.

4. A thermal shield device according to claim 2, wherein the distance between the outer peripheral surface of the silicon monocrystal ingot and the vertical wall is in the range of 10 mm to 30 mm.

5. A thermal shield device according to claim 2, wherein the relationship among the diameter "D1" of the lower edge of the tubular part, the inner diameter "D2" of the quartz crucible, and the diameter "d" of the silicon monocrystal ingot is represented as $1.65d < D1 < D2$.

6. A thermal shield device according to claim 2, wherein the tubular part is formed with a gradual decrease in diameter in a downward direction.

7. A thermal shield device according to claim 2, wherein the tubular part includes an inner tubular part, an outer tubular part, and a thermal-insulating member filled in the space between the inner tubular part and the outer tubular part.

8. A thermal shield device according to claim 2, wherein at least one ring-shaped heat transfer member having an outer peripheral edge connected to the tubular part or the inclined outer wall and an inner peripheral edge connected to the vertical wall or the inclined inner wall, is transversely formed in the inside of the protruding part.

9. A thermal shield device according to claim 2, wherein an inclined outer wall extending in a downward direction with a gradual decrease in diameter is formed as an intersection between the tubular part and the bottom wall and inclined at an angle of 80 degrees or less but not zero with respect to an under surface of the bottom wall so as to satisfy that the relationship between the diameter "d" of the silicon monocrystal ingot and the vertical distance "L2" from the lower edge of the tubular part to the under surface of the bottom wall is represented as $0 \leq L2 \leq d/2$.

10. A thermal shield device according to claim 1, wherein the height "H" of the vertical wall is in the range of 10 mm to d/2 where "d" is the diameter of the silicon monocrystal ingot.

11. A thermal shield device according to claim 1, wherein the distance between the outer peripheral surface of the silicon monocrystal ingot and the vertical wall is in the range of 10 mm to 30 mm.

12. A thermal shield device according to claim 1, wherein the relationship among the diameter "D1" of the lower edge of the tubular part, the inner diameter "D2" of the quartz crucible, and the diameter "d" of the silicon monocrystal ingot is represented as 1.65d<D1<D2.

13. A thermal shield device according to claim 1, wherein the tubular part is formed with a gradual decrease in diameter in a downward direction.

14. A thermal shield device according to claim 1, wherein the tubular part includes an inner tubular part, an outer tubular part, and a thermal-insulating member filled in the space between the inner tubular part and the outer tubular part.

15. A thermal shield device according to claim 1, wherein at least one ring-shaped heat transfer member having an outer peripheral edge connected to the tubular part or the inclined outer wall and an inner peripheral edge connected to the vertical wall or the inclined inner wall, is transversely formed in the inside of the protruding part.

16. A thermal shield device according to claim 1, wherein an inclined outer wall extending in a downward direction with a gradual decrease in diameter is formed as an intersection between the tubular part and the bottom wall and inclined at an angle 80 degrees or less but not zero with respect to an under surface of the bottom wall so as to satisfy that the relationship between the diameter "d" of the silicon monocrystal ingot and the vertical distance "L2" from the lower edge of the tubular part to the under surface of the bottom wall is represented as $0 \leq L2 \leq d/2$.

17. A thermal shield device equipped in a crystal-pulling apparatus for pulling a silicon monocrystal ingot from a silicon melt reserved in a quartz crucible having an outer peripheral surface encircled with a heater, comprising:

a tubular part to be used for surrounding a silicon monocrystal ingot being pulled and grown in an upward direction to prevent radiant heat from the heater toward the silicon monocrystal ingot, having a lower end positioned above a surface of the silicon melt with a space therebetween; and a protruding part formed on a lower portion of the tubular part and filled with a thermal-insulating member, which protrudes in an inward direction and has a bottom wall facing to the silicon melt;

wherein the bottom wall has a shape of a cone having an outer edge connected to a lower edge of the tubular part and extends to the proximity of an outer peripheral surface of the silicon monocrystal ingot, with a gradual decrease in diameter in an upward or downward direction at an angle of 80 degrees or less but not zero with respect to a horizontal plane; and the protruding part includes a vertical wall positioned at a distance from the outer peripheral surface of the silicon monocrystal ingot and connected to an inner edge of the bottom wall, extending in parallel to an axis of the silicon monocrystal ingot or extending at an angle of −30 to +30 degrees with respect to the axis of the silicon monocrystal ingot, and a cone-shaped top wall having a lower edge connected to an upper edge of the vertical wall and an upper edge attached to an inner peripheral surface of the tubular part, extending in an upward direction with a gradual increase in diameter.

18. A thermal shield device according to claim 17, wherein the height "H" of the vertical wall is in the range of 10 mm to d/2 where "d" is the diameter of the silicon monocrystal ingot.

19. A thermal shield device according to claim 17, wherein the distance between the outer peripheral surface of the silicon monocrystal ingot and the vertical wall is in the range of 10 mm to 30 mm.

20. A thermal shield device according to claim 17, wherein the relationship among the diameter "D1" of the lower edge of the tubular part, the inner diameter "D2" of the quartz crucible, and the diameter "d" of the silicon monocrystal ingot is represented as 1.65d<D1<D2.

21. A thermal shield device according to claim 17, wherein the tubular part is formed with a gradual decrease in diameter in a downward direction.

22. A thermal shield device according to claim 17, wherein the tubular part includes an inner tubular part, an outer tubular part, and a thermal-insulating member filled in the space between the inner tubular part and the outer tubular part.

23. A thermal shield device according to claim 17, wherein at least one ring-shaped heat transfer member having an outer peripheral edge connected to the tubular part or the inclined outer wall and an inner peripheral edge connected to the vertical wall or the inclined inner wall, is transversely formed in the inside of the protruding part.

24. A thermal shield device equipped in a crystal-pulling apparatus for pulling a silicon monocrystal ingot from a silicon melt reserved in a quartz crucible having an outer peripheral surface encircled with a heater, comprising:

a tubular part to be used for surrounding a silicon monocrystal ingot being pulled and grown in an upward direction to prevent radiant heat from the heater toward the silicon monocrystal ingot, having a lower end positioned above a surface of the silicon melt with a space therebetween; and a protruding part formed on a lower portion of the tubular part and filled with a thermal-insulating member, which protrudes in an inward direction and has a bottom wall facing to the silicon melt;

wherein the bottom wall includes an outer bottom wall having an outer edge connected to a lower edge of the tubular part, which is inclined at an angle of 80 degrees or less but not zero with respect to a horizontal plane, with gradual decrease in diameter in a downward direction, and an inner bottom wall having an outer edge connected to a lower edge of the outer bottom wall and an inner edge extending to the proximity of the outer peripheral surface of the silicon monocrystal ingot, which is inclined at an angle of 80 degrees or less but not zero with respect to a horizontal plane, with a gradual decrease in diameter in an upward direction; and the protruding part includes a vertical wall positioned at a distance from the outer peripheral surface of the silicon monocrystal ingot and connected to an inner edge of the bottom wall, which extends in parallel to an axis of the silicon monocrystal ingot or extending at an angle of −30 to +30 degrees with respect to the axis of the silicon monocrystal ingot, and a cone-shaped top wall having a lower edge connected to an upper edge of the vertical wall and an upper edge attached to an inner peripheral surface of the tubular part, extending in an upward direction with a gradual increase in diameter.

25. A thermal shield device according to claim 24, wherein the height "H" of the vertical wall is in the range of 10 mm to d/2 where "d" is the diameter of the silicon monocrystal ingot.

26. A thermal shield device according to claim 24, wherein the distance between the outer peripheral surface of the silicon monocrystal ingot and the vertical wall is in the range of 10 mm to 30 mm.

27. A thermal shield device according to claim 24, wherein the relationship among the diameter "D1" of the lower edge of the tubular part, the inner diameter "D2" of the quartz crucible, and the diameter "d" of the silicon monocrystal ingot is represented as 1.65d<D1<D2.

28. A thermal shield device according to claim 24, wherein the tubular part is formed with a gradual decrease in diameter in a downward direction.

29. A thermal shield device according to claim 24, wherein the tubular part includes an inner tubular part, an outer tubular part, and a thermal-insulating member filled in the space between the inner tubular part and the outer tubular part.

30. A thermal shield device according to claim 24, wherein at least one ring-shaped heat transfer member having an outer peripheral edge connected to the tubular part or the inclined outer wall and an inner peripheral edge connected to the vertical wall or the inclined inner wall, is transversely formed in the inside of the protruding part.

* * * * *